(12) United States Patent  
Marom et al.

(10) Patent No.: US 8,534,937 B2
(45) Date of Patent: Sep. 17, 2013

(54) PLATE DEVELOPER WITH A CONFIGURABLE TRANSPORT PATH

(75) Inventors: Moshe Marom, Kfar Saba (IL); Kalman Shamir, Herzlia (IL); Raffi Lender, Ramat Hasharon (IL); Ilan Levi, Natanya (IL)

(73) Assignee: Eastman Kodak Company, Rochester, NY (US)

( * ) Notice: Subject to any disclaimer, the term of this patent is extended or adjusted under 35 U.S.C. 154(b) by 853 days.

(21) Appl. No.: 12/581,198

(22) Filed: Oct. 19, 2009

(65) Prior Publication Data

US 2011/0091200 A1 Apr. 21, 2011

(51) Int. Cl.
*G03D 3/08* (2006.01)

(52) U.S. Cl.
USPC ........................................................ 396/617

(58) Field of Classification Search
USPC ........................................................ 396/617
See application file for complete search history.

(56) References Cited

U.S. PATENT DOCUMENTS

| 3,776,119 | A | * | 12/1973 | Slingsby et al. | 396/582 |
| 4,001,854 | A | * | 1/1977 | Formoy | 396/565 |
| 4,128,326 | A | * | 12/1978 | Selak | 396/611 |
| 5,140,355 | A | * | 8/1992 | Haag et al. | 396/571 |
| 5,296,906 | A | * | 3/1994 | Hano et al. | 399/385 |
| 5,715,034 | A | * | 2/1998 | Yamamoto | 355/40 |
| 5,966,198 | A | * | 10/1999 | Yamamoto et al. | 355/27 |
| 6,152,618 | A | * | 11/2000 | Jensen et al. | 396/612 |
| 7,118,296 | B2 | * | 10/2006 | Itoh | 396/612 |
| 2002/0191977 | A1 | * | 12/2002 | Nozawa et al. | 396/612 |
| 2011/0091200 | A1 | * | 4/2011 | Marom et al. | 396/617 |

FOREIGN PATENT DOCUMENTS

| EP | 0 346 921 A2 | 12/1989 |
| EP | 0 484 087 A2 | 5/1992 |

* cited by examiner

*Primary Examiner* — Rodney Fuller
(74) *Attorney, Agent, or Firm* — Nelson Adrian Blish

(57) ABSTRACT

A development device (100) for printing plates (112) includes a straight transport unit (116) adapted to transport printing plates inside the development device in a straight transport path (116), an immersed transport unit (120) adapted to transport printing plates inside the development device in an immersed path (120), and a switching element (232, 244*b*) adapted to switch between the straight transport unit (116) and the immersed transport unit (120).

11 Claims, 8 Drawing Sheets ably over the immersed transport path 120. Devices using the immersed path are used when processing is done with a developer liquid 108, which oxidize rapidly in open air.

PLATE DEVELOPER WITH A CONFIGURABLE TRANSPORT PATH

FIELD OF THE INVENTION

This present invention relates to an apparatus and method for development of printing plates.

BACKGROUND OF THE INVENTION

Lithographic digital printing plates are imaged on dedicated opto-mechanical plate setters. The imaged plates undergo a chemical development stage, usually performed by a plate developing processor device 100 (shown in FIG. 1A). Device 100 receives plates for development through plate inlet 128. Device 100 is covered with plate developer cover 124. The development process uses chemical development material in a liquid form. The material is filled into the developer tank 104, shown in FIGS. 1B and 1C, within the plate processor device.

After a printing plate 112 is imaged, it is be transported through the plate processor device for processing, consuming a portion of the developer liquid 108, residing in developer section tank 104.

A plate developer device 100 may use a straight transport path 116, shown in FIG. 1B, or an immersed transport path 120 in order to transport printing plate 112 inside developer 100. Each of these distinct transport path schemes has advantages and disadvantages.

The straight transport path 116 enables smooth movement of printing plate 112 and avoids plate deformation, while moves inside developer 100. On the other hand, it requires spraying the developer liquid 108 over the top side of printing plate 112 using spray bars during the movement of printing plate 112 inside developer 100. This may cause uneven distribution of developer liquid 108 over printing plate 112. In addition, spraying the developer liquid 108 on top of printing plate 112, will also cause oxidation of developer liquid 108, due to open air exposure. Both, the uneven liquid distribution as well as the liquid oxidation may affect the quality of plate development.

The immersed transport path 120, wherein the entire printing plate 112 is fully immersed in liquid 108 during plate movement in device 100, enables even distribution of plate developer liquid 108 on printing plate 112. In addition, in this configuration, developer liquid 108 has minimal exposure to air, thus oxidation is minimized. On the other hand, the immersed transport path 120 requires dipping printing plate 112 deep inside developer tank 104, creating a complex plate movement path inside developer 100. This may cause printing plate 112 to deform during the plate transport stage inside device 100.

In general the straight transport path 116 is usually preferable over the immersed transport path 120. Devices using the immersed path are used when processing is done with a developer liquid 108, which oxidize rapidly in open air.

There is a need for employing both transport paths (116 and 120) in a single developer device 100. The combination of both transport paths in a single device enables a processor to use a variety of plates as well as developer liquids at one printing site.

SUMMARY OF THE INVENTION

Briefly, according to one aspect of the present invention a development device for printing plates includes a straight transport unit adapted to transport printing plates inside the development device in a straight path; an immersed transport unit adapted to transport printing plates inside the development device in an immersed path; and a switching element adapted to switch between the straight transport unit and the immersed transport unit.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

Figure 1A:
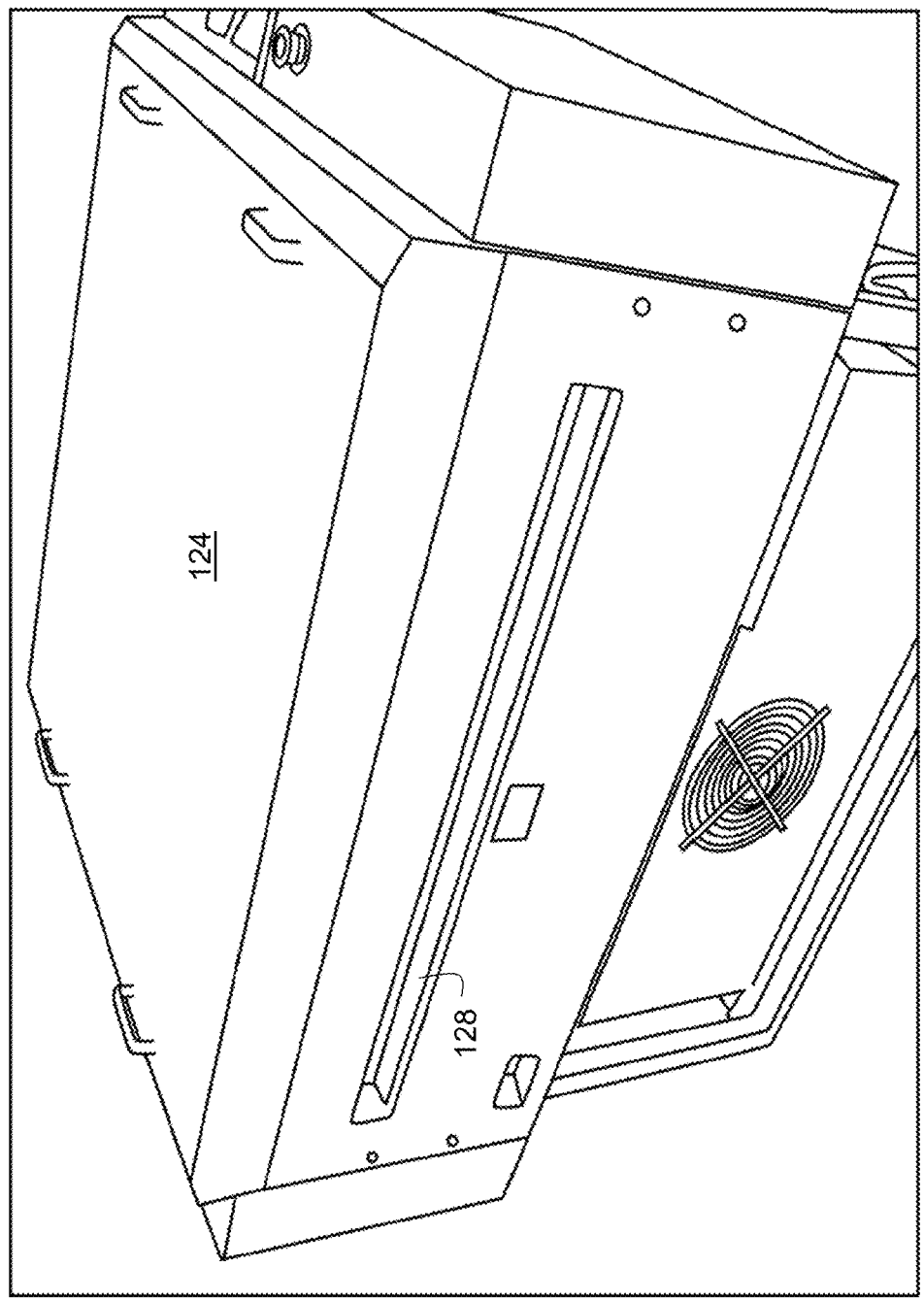
FIG. 1A is a schematic illustration showing a plate developer device.
Figure 1B:
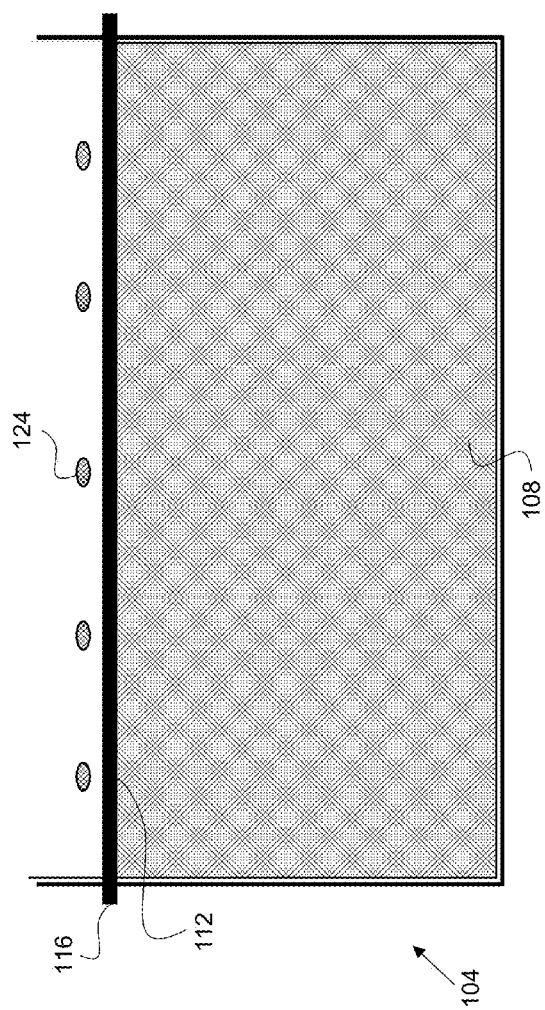
FIG. 1B is a prior art schematic illustration of a printing plate being transported in a plate developer using straight transport path.
Figure 1C:
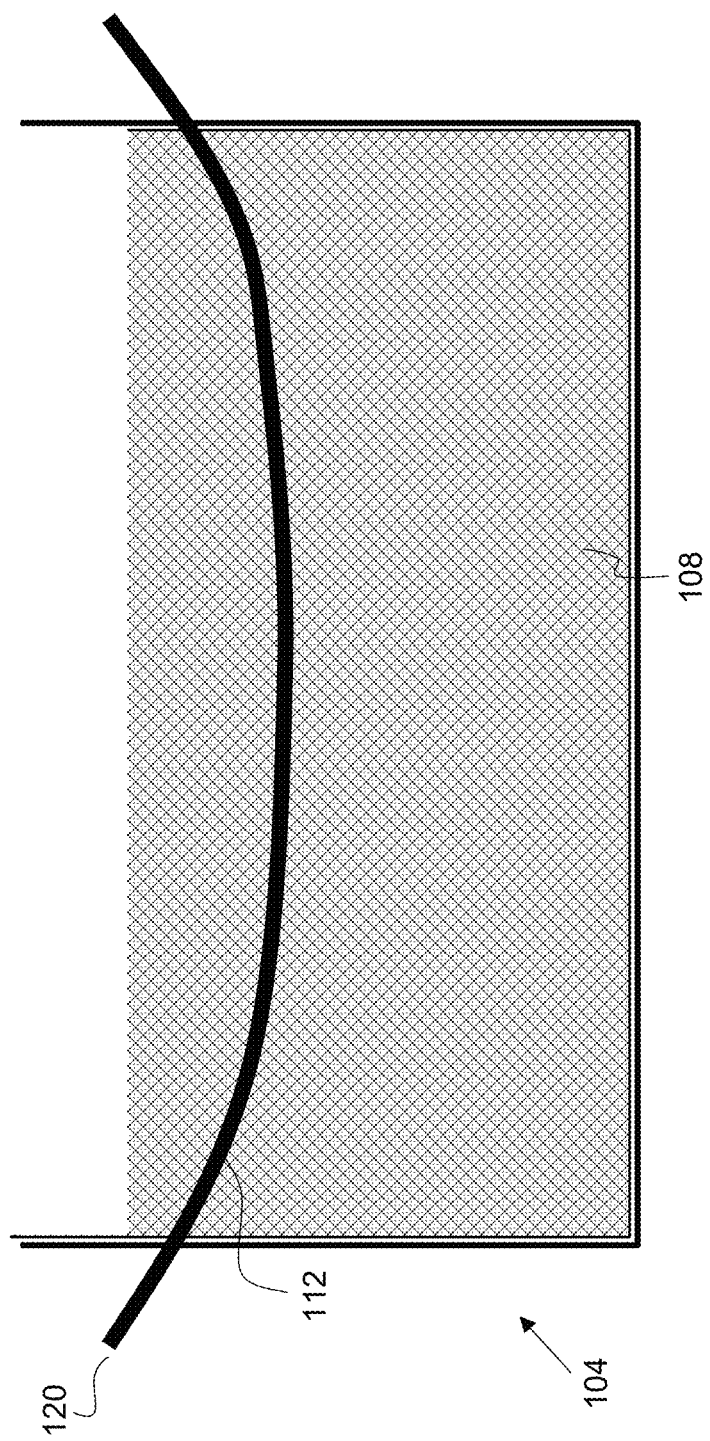
FIG. 1C is a prior art schematic illustration of a printing plate being transported in a plate developer using immersed transport path.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2:
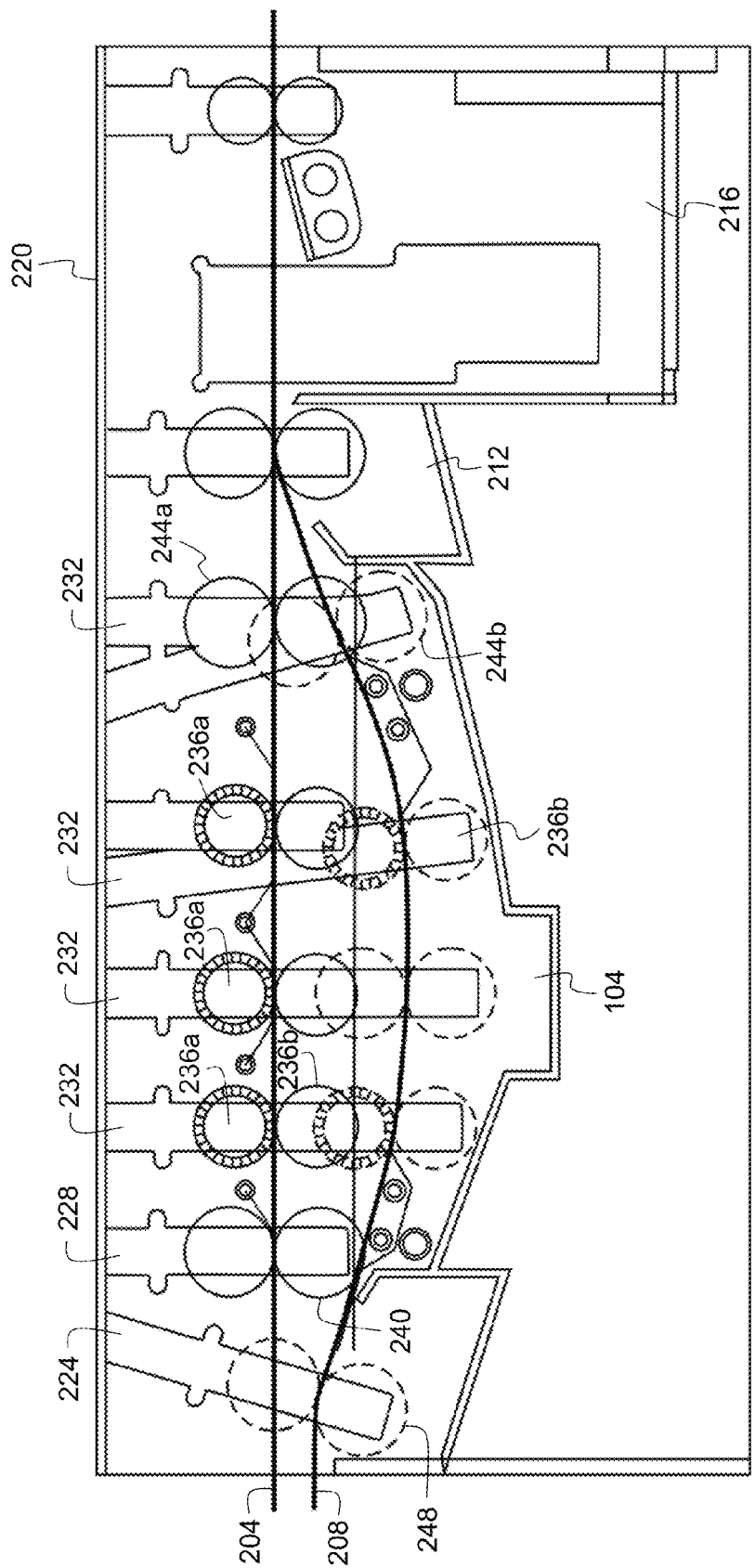
FIG. 2 is a schematic showing elements for interchangeable transport path between straight to immersed paths.

FIG. 2 shows a cross section view of an interchangeable transport path within a plate developer device 100 equipped with means for switching between straight and immersed transport paths (116 and 120). The developer includes a tank section 104, followed by a plate washing section 212, which is followed by a plate drying section 216. All the sections are covered, during normal operation, by developer hood 220.

Both transport paths use plurality of elements such as slots, brush rollers, and transport rollers. Each slot is adapted to hold a suitable roller. Some of the elements are used in conjunction with a specific transport path, either straight or immersed, while others are interchangeable between both transport paths.

Figure 3:
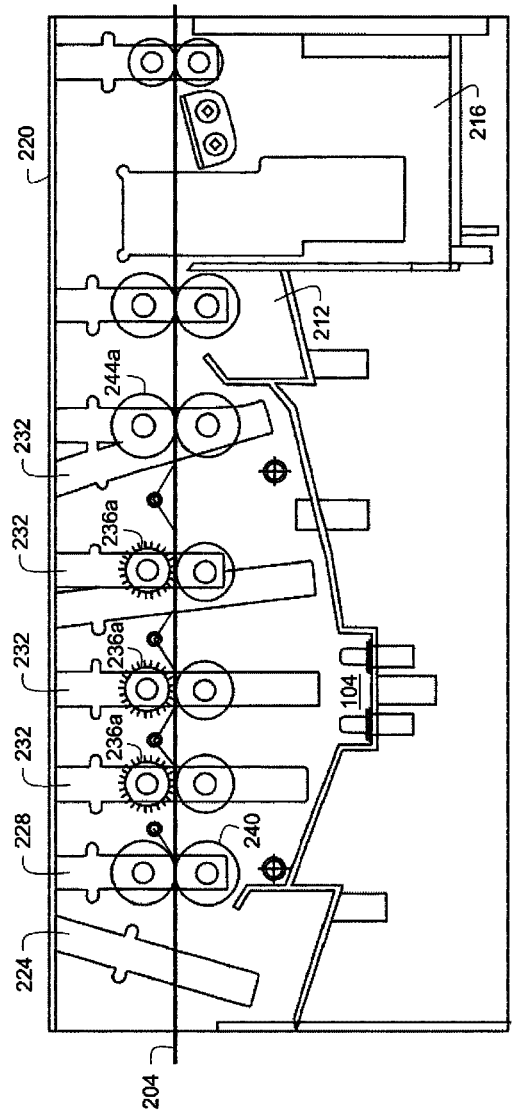
FIG. 3 is a schematic showing straight transport path configuration.
Figure 5:
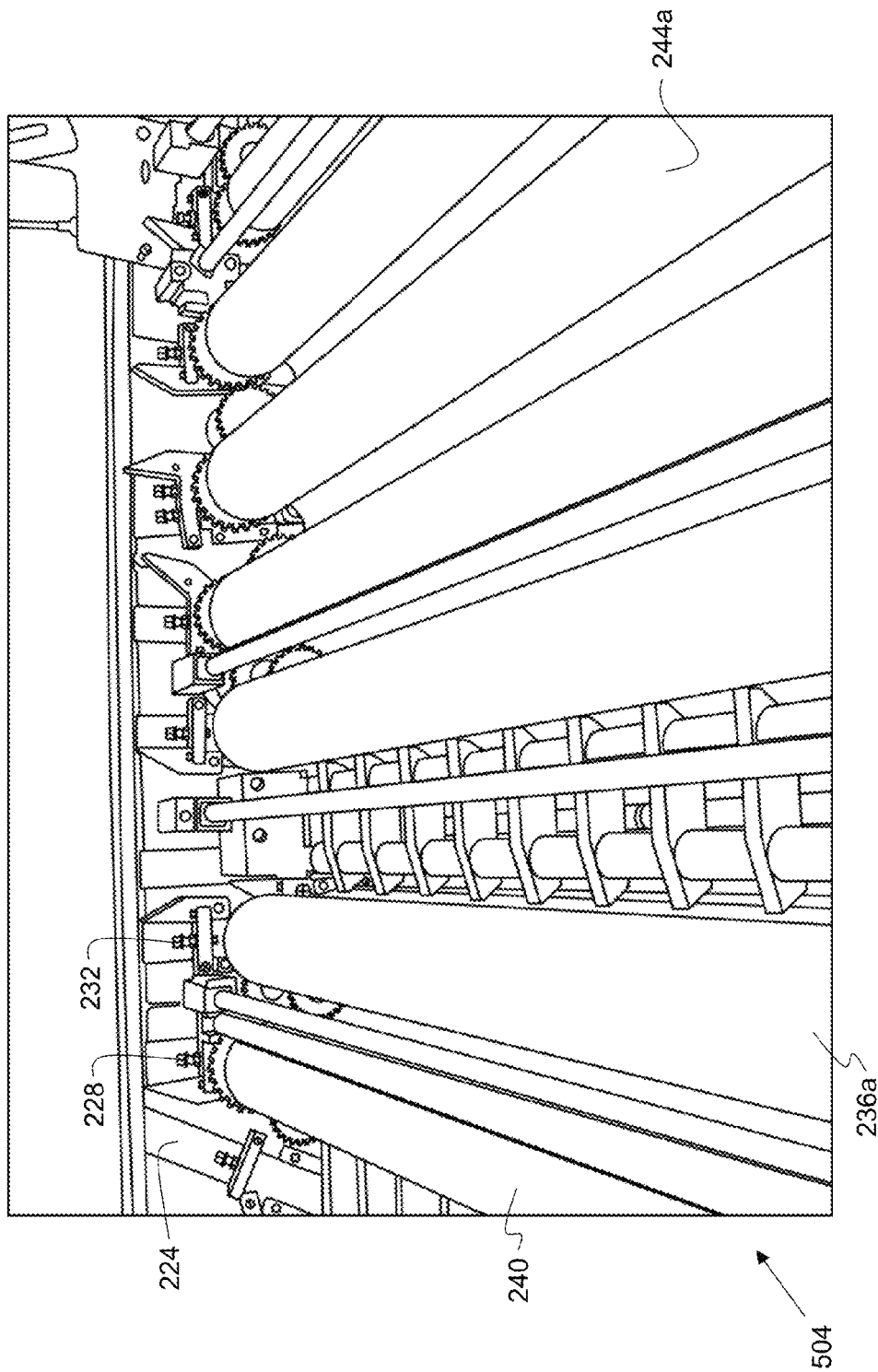
FIG. 5 is illustrates a top view of a straight transport path configuration inside of a plate developer.

FIGS. 3 and 5 show a straight transport path configuration. FIG. 5 shows a straight transport path configuration top view 504. Transport roller 240 is plugged into slot 228, which is used only for the straight transport path. Brush rollers are plugged into brush rollers positions 236a, and transport rollers into transport rollers positions 244a of slots 232. Slots 232 are interchangeable between both transport paths. This configuration will create a straight transport path for printing plate 112 which are inserted into device 100 through plate straight transport path inlet 204.

Figure 4:
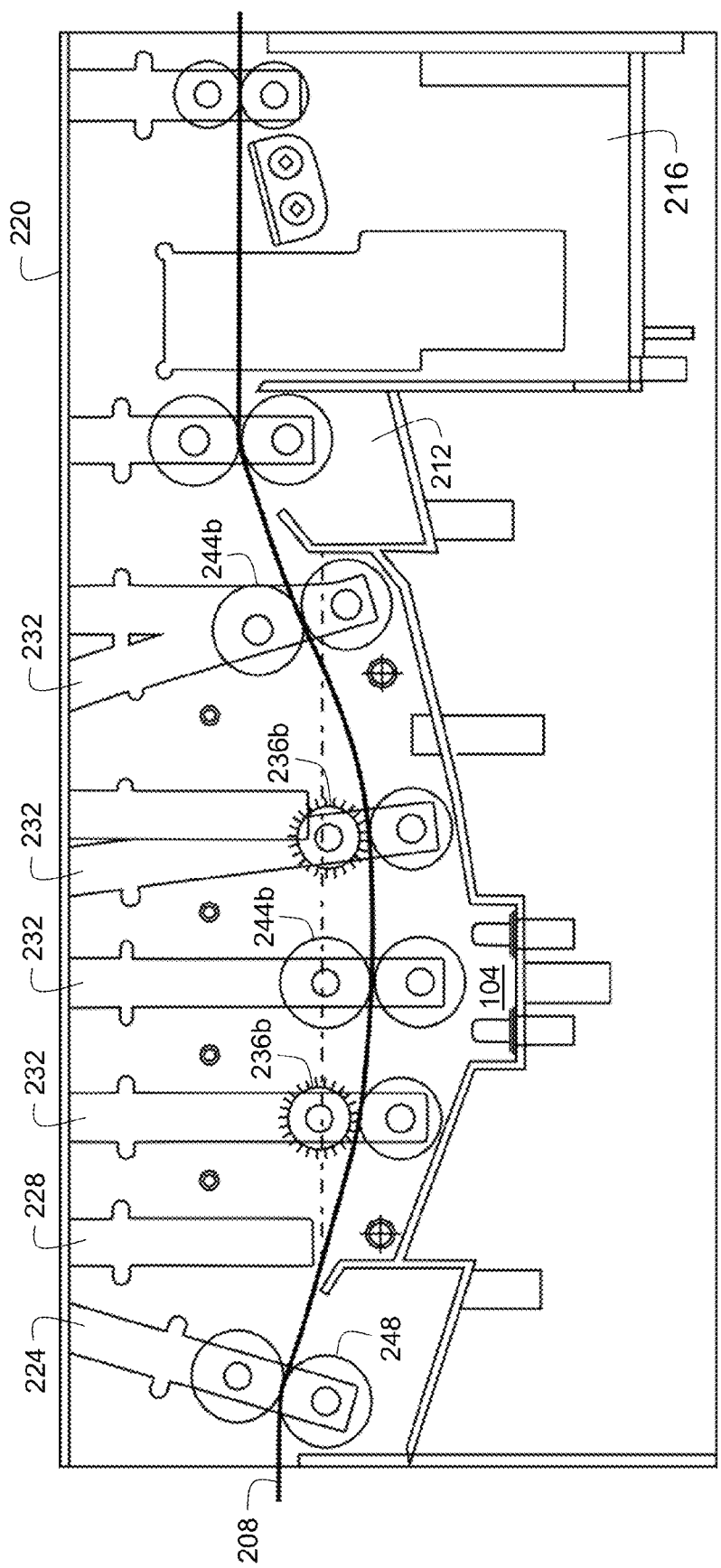
FIG. 4 is a schematic showing immersed transport path configuration.
Figure 6:
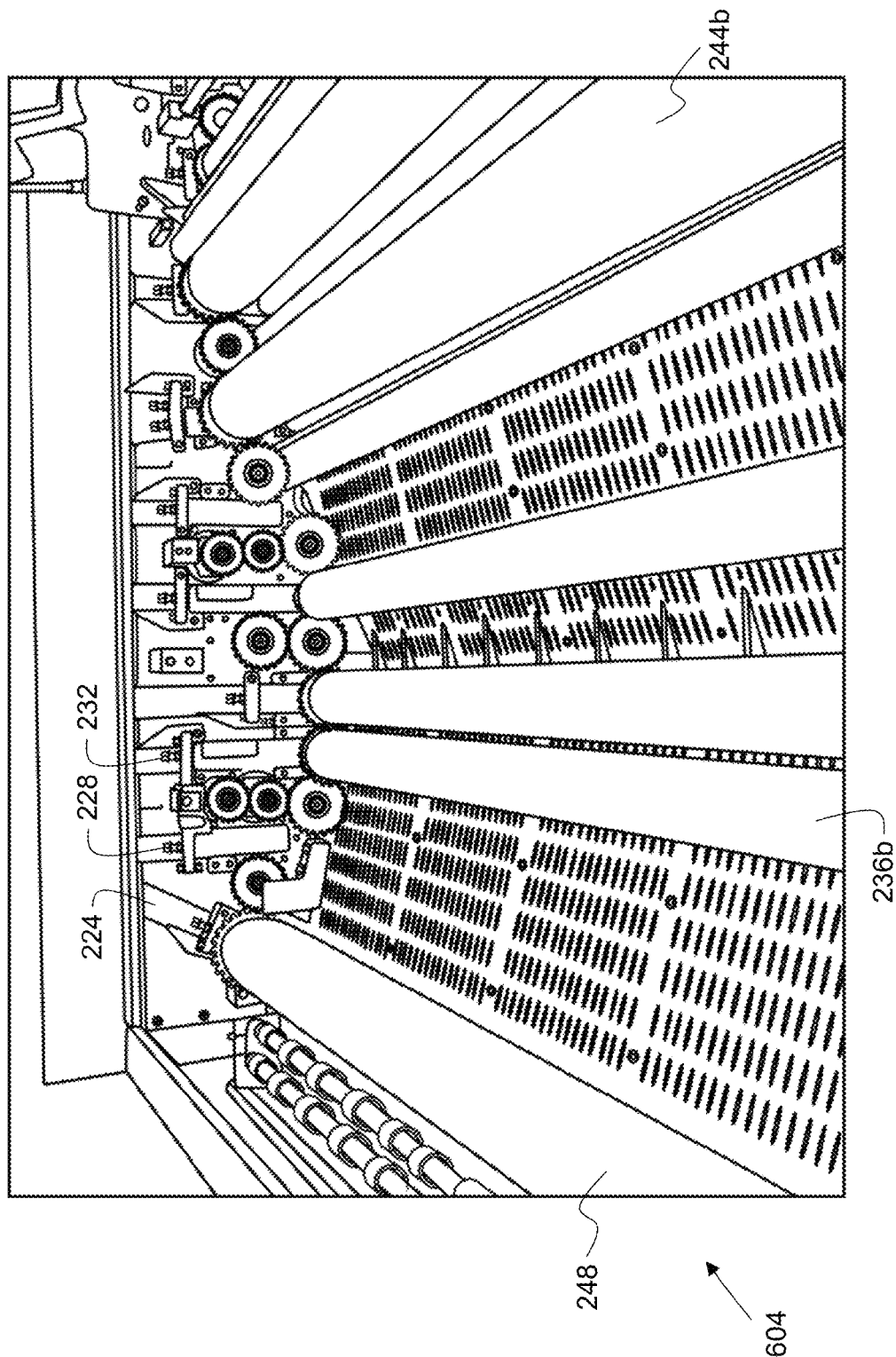
FIG. 6 is illustrates a top view of an immersed transport path configuration inside of a plate developer.

Alternatively FIGS. 4 and 6 show an immersed transport path configuration. FIG. 6 shows an immersed transport path configuration top view 604. Transport roller 248 is plugged into slot 224, which is used only for the immersed transport path. Brush rollers are plugged into brush rollers positions 236b, and transport rollers into transport rollers positions 244b of slots 232, which are interchangeable between both transport paths. This configuration will create an immersed transport path for printing plate 112 which are to be inserted into device 100 through plate immersed transport path inlet 208.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

PARTS LIST 100 plate developing processor device
104 developer tank
108 developer liquid
112 printing plate
116 straight transport path
120 immersed transport path
124 plate developer cover
128 plate inlet
204 plate straight transport path inlet
208 plate immerse transport path inlet
212 plate washing section
216 plate drying section
220 developer hood
224 slot for immerse transport path
228 slot for straight transport path
232 slots interchangeable between immerse and straight transport path
236a brush rollers positions for straight transport path
236b brush rollers positions for immerse transport path
240 rollers for straight transport path only
244a transport rollers positions for straight path
244b interchangeable rollers positions for immerse path
248 rollers for immersed transport path only
504 straight transport path configuration top view
604 immerse transport path configuration top view

The invention claimed is:

1. A development device for printing plates comprising:
   a straight transport for transporting said printing plates inside said development device in a straight path above a developer liquid;
   an immersed transport for transporting said printing plates inside said development device in a non-straight path that passes through the developer liquid; and
   switching elements adapted to change the path of the printing plates between the straight transport path and the non-straight transport path wherein the transport path is switched from said straight transport to said immersed transport or from said immersed transport to said straight transport by physically mounting said switching elements in a first position for said straight transport of in a second position.

2. The device according to claim 1 wherein said switching elements are selected from a group consisting of a brush roller, transport roller, configurable slot, and combinations thereof.

3. The device according to claim 2 wherein said at least one configurable slot is adapted to be configured for said straight transport unit and for said immersed transport unit.

4. The device according to claim 2 wherein said at least one transport roller is adapted to be configured for said straight transport unit and for said immersed transport unit.

5. The device according to claim 2 wherein said at least one brush roller is adapted to be configured for said straight transport unit and for said immersed transport unit.

6. The device according to claim 2 wherein said at least one configurable slot is adapted to be configured for said straight transport unit.

7. The device according to claim 2 wherein said at least one configurable slot is adapted to be configured for said immersed transport unit.

8. The device according to claim 2 wherein said at least one transport roller is adapted to be configured for said straight transport unit.

9. The device according to claim 2 wherein said at least one transport roller is adapted to be configured for said immersed transport unit.

10. The device according to claim 2 wherein said at least one brush roller is adapted to be configured for said straight transport unit.

11. The device according to claim 2 wherein said at least one brush roller is adapted to be configured for said immersed transport unit.

* * * * *